United States Patent
Berggren et al.

(10) Patent No.: US 6,424,553 B2
(45) Date of Patent: Jul. 23, 2002

(54) MULTIDIMENSIONAL ADDRESSING ARCHITECTURE FOR ELECTRONIC DEVICES

(75) Inventors: Rolf Magnus Berggren, Vreta Kloster (SE); Per-Erik Nordal, Asker; Geirr Ivarsson Leistad, Sandvika, both of (NO)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 09/817,359

(22) Filed: Mar. 22, 2001

(30) Foreign Application Priority Data

Mar. 22, 2000 (NO) .................................................. 001469

(51) Int. Cl.[7] .............................................. G11C 5/02
(52) U.S. Cl. ................. 365/51; 365/230.01; 365/230.02
(58) Field of Search .............................. 365/51, 230.01, 365/230.02, 230.06

(56) References Cited

U.S. PATENT DOCUMENTS

| | | |
|---|---|---|
| 4,287,571 A | 9/1981 | Chakravarti et al. |
| 5,075,889 A | 12/1991 | Jousselin et al. |
| 5,742,086 A | 4/1998 | Rostoker et al. |
| 5,802,607 A | 9/1998 | Triplette |
| 6,021,074 A * | 2/2000 | Blish, II ..................... 365/200 |

FOREIGN PATENT DOCUMENTS

| | | |
|---|---|---|
| WO | WO 98/58383 | 12/1998 |
| WO | WO 99/08325 | 2/1999 |
| WO | WO 99/12170 | 3/1999 |
| WO | WO 99/40631 | 8/1999 |

* cited by examiner

Primary Examiner—Richard Elms
Assistant Examiner—VanThu Nguyen
(74) Attorney, Agent, or Firm—Jacobson Holman, PLLC

(57) ABSTRACT

A device for providing addressability in an apparatus including one or more volume elements which together with the device form part of a matrix in the apparatus. The device establishes an electrical connection to specific cells by electrodes in the matrix and thereby defining a cell in the volume element. The device includes at least three sets of plural strip-like electrodes, the strip-like electrodes of each set being provided in substantially parallel relationship to each other in a two-dimensional and planar layer forming an additional part of the matrix. A set of strip-like electrodes in one layer is oriented at an angle to the projected angle of orientation of the electrode sets in proximal neighboring layers onto this one layer, such that the sets of strip-like electrodes in proximal neighboring layers exhibit a mutual non-orthogonal relationship.

16 Claims, 9 Drawing Sheets

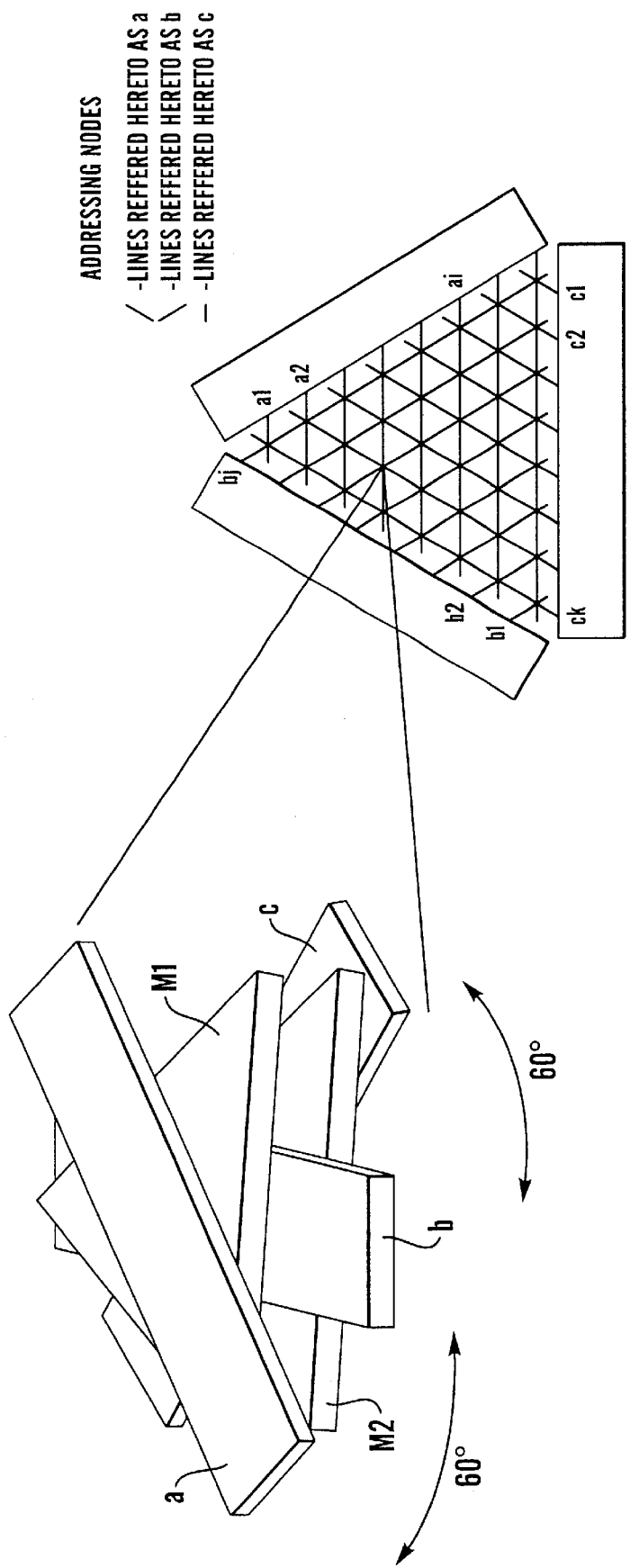

MULTIDIMENSIONAL ADDRESSING ARCHITECTURE FOR ELECTRONIC DEVICES

FIELD OF THE INVENTION

The present invention concerns a means for providing addressability in an apparatus comprising one or more volume elements, wherein said volume or volume elements together with said means form a part of a two- or three-dimensional matrix in said apparatus, wherein a volume element comprises one or more cells having a data storage, data-processing or signal-processing functionality depending on the electronic or electric properties of a material of said volume element, wherein said means provides addressability to a specific location in a volume element by establishing a selective electrical connection to said volume element or in case said volume element comprises more than one cell, a specific cell thereof, wherein the selection of a specific volume element or cell thereof takes place by a providing a not necessarily simultaneous electrical connection to three or more electrodes formed by said means and contacting said volume element for effecting a selective interaction therewith in a region thereof in close proximity to said electrodes, and wherein said region defines a cell in said volume element thus interacted upon.

The present invention also concerns an apparatus comprising such means wherein the means together with one or more volume elements form a part of a two- or three-dimensional matrix in said apparatus, wherein a volume element comprises one or more cells having a data storage, data-processing or signal-processing functionality depending on the electronic or electric properties of a material of said volume element, and wherein the apparatus comprises more than one matrix of this kind.

Generally the present invention discloses addressing architectures that provide electronic N-terminal access to volume elements or regions thereof in two- or three-dimensional matrix structures, where the number N of terminals to be connected at each address in the matrix is at least three.

BACKGROUND OF THE INVENTION

Orthogonal addressing matrices in two dimensions are employed extensively in a wide variety of electronic devices such as cameras, memory devices and displays where it is required to have unique electronic access to each individual matrix element.

The simplest type of matrices consists of one set of mutually parallel electrode lines (termed "a" electrodes below) in one plane, located in proximity to another parallel plane containing another set of mutually parallel electrode lines (termed "b" electrodes below). The "a" and "b" set of electrodes are oriented so as to cross each other, typically in orthogonal fashion, providing addressability to the volume elements between the crossing electrodes. Thus, the volume element between electrode $a_i$ in the "a" electrode set and electrode $b_j$ in the "b" electrode set can be acted upon electrically by connecting the electrodes $a_i$ and $b_j$ to an appropriate source of current or voltage. The volume elements can accommodate active circuit elements capable of being triggered by an input signal, or in themselves be provided as switching or as passive elements, a physical state of which may be altered by applying an input signal or detected upon addressing in the "a" and the "b" electrodes, then being capable of realizing memory elements for storing binary or multilevel logical values.

A device based on matrices of this kind are e.g. disclosed in International patent application No. PCT/NO98/00185 (U.S. Pat. No. 6,055,180), assigned to the present applicant. This concerns an electrically addressable passive device which can be used in optical detector means, volumetric data storage devices or data processing devices. The disclosed device comprises a functional medium in the form of a continuous or patterned structure which may undergo a physical or chemical change of state. This functional medium which corresponds to the volume element or the present invention, comprises individually addressable cells provided between the anode and cathode in an electrode means which contacts the functional medium in the cell and causes an electrical coupling thereto. The anodes are provided as a first set parallel stripe-like electrodes in a layer contacting the functional medium on one side and the cathodes are provided as a second set of stripe-like electrodes that contacts the functional medium on the other side, the stripe-like electrodes in each set being mutually parallel and each electrode set being oriented such that the electrodes therein in one are oriented orthogonal with respect to the electrodes in the other. In practice a cell in the volume element of the functional medium is now defined at the crossing of a stripe-like electrode of the first set with a stripe-like electrode of the second set. When a cell in this device is addressed, e.g. for writing, reading or switching of e.g. a logical value assigned to a cell, electric energy is applied directly to the functional medium of the cell via a selected pair of crossing electrodes in respectively the first and the second set.

International patent application No. PCT/NO98/00212, likewise assigned to the present applicant discloses, a similar device, wherein, however, the electrode matrix is provided with the electrode set mutually isolated in a bridge arrangement and the functional medium provided over and covering the electrode sets. In addition to its possible use as an electrical addressable memory device, this particular arrangement with bridged electrodes covered by the functional medium, as opposed to the above-mentioned device wherein the functional medium is provided in sandwich between the electrodes, facilitates its use in for instance in an optical or electronic camera or in a chemical camera or in an electrically addressable display device.

Finally International patent application PCT/NO98/00237, also assigned to the present applicant, discloses a ferroelectric device for processing and/or storage of data with passive electrical addressing of the functional medium which is a thin film of ferroelectric material provided over and covering the electrode sets which also here are provided in a bridged arrangement.

In all the above-mentioned devices the functional medium corresponding to a volume element provided between or over the electrode sets can be deposited as a global layer, in which the individual cells of course, always will be defined by the crossings between electrodes in the first and second electrode set respectively. However, the functional medium forming the element may also be patterned or pixelated such that individual volume elements is provided between or over the crossing of the electrodes in the respective sets, thereby forming a volume element comprising only one cell. This, of course, does not affect the total possible number of cells in the matrix, as this essentially will be the product of the number of electrodes in each set.

In arrays and matrices of the above-mentioned kind that store or process electrical signals the matrix or array elements thus defined may include various kind of components and circuitry, depending on the application, but at each crossing point only two independent electrical connections to the outside world is possible. Thus, the two sets of electrodes can only support exclusive addressing to two terminal devices or circuits, due to the two dimensions available.

Several approaches are used today in electronic systems based on matrices and where each matrix element requires more than two terminal connections. In SRAM technology the memory cells require more than two terminals, i.e. Vcc, bit, –bit and word. A prior art matrix solution for addressing the memory cells in SRAM technology is shown in FIG. 1 and uses two parallel lines, Vcc line and word line, oriented perpendicular to two other parallel lines, –bit and bit lines. No exclusive addressing can be obtained between the two parallel lines, i.e. no exclusive addressing between –bit and bit for instance.

Another prior art solution for realizing exclusive addressing between more than two lines (or electrodes) is shown in FIG. 2. Here a three-dimensional matrix is used. Exclusive addressing is now obtained between a certain set of lines $a_i$, $b_j$ and $c_k$. By only choosing the combination $a_i$, $b_j$ a column is chosen and a specific element is not addressed until also $c_k$ is specified. Any element that fulfils the requirement $i\epsilon(1, i_{max})$, $j\epsilon(1, j_{max})$ and $k\epsilon(1, k_{max})$ can be reached through an addressing combination of $a_i$, $b_j$ and $c_k$.

The physical implementation of the addressing schemes discussed above is not simple when each element in the matrix shall be accessed by three or more terminals.

In two-dimensional prior art cases, as exemplified above for SRAM devices and shown in FIG. 1, electronic circuitry is typically made in quasi-planar fashion when the physical location of each element in the matrix is defined by two coordinates. Layer is built upon layer in a series of deposition, masking and etching steps involving precision alignment operations, etc. This approach affords only limited scalability and flexibility, and leads to rapidly increasing topological complexity as the number of terminals at each matrix coordinate increases.

Regarding true three-dimensional matrix addressing schemes as shown in FIG. 2, there are as far as can be ascertained no examples of high-density prior art devices made by mass manufacturing processes. In practice functional addressing schemes for matrix addressing in three-dimensions have not been easy to implement while simultaneously achieving low complexity and high compatibility with simple and cheap manufacturing processes.

SUMMARY OF THE INVENTION

Thus it is a major object of the present invention to obviate the above-mentioned disadvantages of the prior art by providing generic architectures for addressing N-terminal (N>2) electronic devices or elements arranged physically in matrix fashion in two or three dimensions.

Another object of the present invention is to provide a simple and practical means for uniquely connecting a single N-terminal element in a two-dimensional matrix with n external voltage or current terminals, where $2 \leq n \leq N$.

The above-mentioned objects and other features and advantages are achieved according to the invention with a means which is characterized in that it comprises at least three sets of plural electrically conducting lines or strip-like electrodes, that each electrode set comprises said strip-like electrodes provided in a substantially parallel relationship to each other in a respective two-dimensional planar layer forming an additional part of said matrix, said layers of electrode sets being substantially mutually parallel, that a set of strip-like electrodes in one layer is oriented at an angle to the projected angle of orientation of the electrode sets of the proximal neighbouring layers on said one layer, such that said sets or strip-like electrodes in proximal neighbouring layers exhibit a mutual non-orthogonal relationship, and that said electrodes contacting a said region of a volume element are formed by a crossing of three or more of said strip-like electrodes in said respective electrode sets contacting said volume element, such that said cell or cells of said volume element in any case is located therein between or at said crossing of said three or more strip-like electrodes, a selective addressing of a cell taking place by applying a current or voltage to a selected strip-like electrode in each of the electrode sets either simultaneously or in a temporal sequence defined by a predetermined addressing protocol.

In an advantageous embodiment of the means according to the invention the substantially parallel strip-like electrodes are provided equidistantly spaced apart.

In another advantageous embodiment of the means according to the invention an electrode set in the matrix is provided rotated about an axis substantially perpendicular thereto, by a given angle or angles, in relation to at least the proximal neighbouring electrode sets, such that none of the strip-like electrodes in said proximal neighbouring electrode sets conformally overlap. Preferably are then all electrode sets in the matrix are provided mutually rotated about an axis substantially perpendicular thereto, by a given angle or angles such that none of the strip-like electrode in any other electrode sets conformally overlap, or alternatively is the given angle of rotation between an electrode set and a following proximal neighbouring electrode set $2\pi/m \cdot N$ or 360°$/m N$, N being the number of the strip-like electrodes respectively contacting a terminal in a cell and m an integer such that $m \leq N$.

In various advantageous embodiments of the means according to the invention the means comprises three electrode sets for providing an electrical connection to cells with up to three terminals, or four electrode sets for providing an electrical connection to cells with up to four terminals, or three electrode sets for providing an electrical connection to at least two cells with up to two terminals each.

According to the invention the number of strip-like electrodes provided in a respective electrode set is selected with regard to the number and geometrical arrangements of the cells in the matrix, so as to maximize the number of addressable cells therein, and preferably is then a number of strip-like electrodes provided in a respective electrode set is selected so as to enable the addressing of a cell in the matrix.

In an embodiment of the means according to the invention wherein each cell in a volume element in the matrix is provided with at least two terminals, it is considered advantageous providing the electrode layers and the layer or layers forming the volume element in a sandwich arrangement, an electrode adjoining a surface of at least one volume element layer in an interfacing relationship thereto, whereby the crossing between the strip-like electrodes in each electrode layer defines a cell in the volume element, and preferably is then a diode junction provided between an electrode in an electrode crossing and a cell defined thereby.

Finally, an embodiment of the means according to the invention wherein one or more cells in the volume element comprises at least one transistor structure at least one electrode in at least two electrode sets respectively contacts the terminals of said at least one transistor structures, and if more than one volume element comprises more than one transistor structure, then preferably at least one electrode in at least two electrode sets respectively connects the transistors electrically with each other via the terminals thereof.

The apparatus according to the present invention is characterized in that the matrices are provided in a stacked arrangement, whereby the apparatus forms a volumetric structure of stacked matrices for data storage, data processing, or a signal processing as given by the functionality of each matrix in the stack.

In an advantageous embodiment of the apparatus according to the invention the apparatus is provided on a substrate comprising integrated circuitry connected with the electrodes of the means for implementing driving control and error correcting functions in the cells of the volume elements of the matrices.

BRIEF DESCRIPTION OF THE DRAWINGS

The invention shall now be described in more detail with a discussion of exemplary embodiments taken in conjunction with the accompanying drawings, of which

DETAILED DESCRIPTION OF THE PREFERRED EMBODIMENTS

Figure 1:
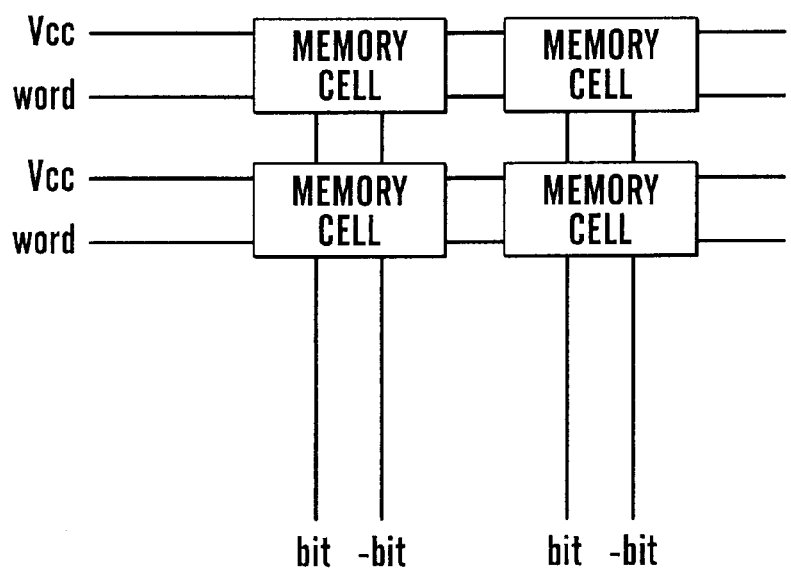
FIG. 1 shows as mentioned above an example of prior art matrix addressing with four terminal line, FIG. 2 as mentioned above a prior art orthogonal three-dimensional matrix scheme, FIGS. 3a,b a prior art orthogonal matrix addressing scheme for devices with three terminals, consisting of two two-terminal sub-units, FIG. 4 an addressing matrix according to the present invention, FIGS. 5a–5d variants of a first embodiment of addressing matrices according to the present invention, FIGS. 6a–6f variants of a second embodiment of the present invention, FIGS. 7a–7e variants of a third embodiment of the present invention, FIGS. 8a,b an example of a preferred embodiment of the present invention, and FIG. 9 an example of an embodiment of the present invention where elements at crossing points in a matrix exhibit rectifying diode behaviour.

FIG. 1 shows as already discussed in the introduction, a prior art addressing scheme for 4 SRAM memory cells in a planar orthogonal matrix. Four lines are necessary, representing updating, writing and reading. If bit and –bit are chosen, an entire column is addressed.

Figure 2:
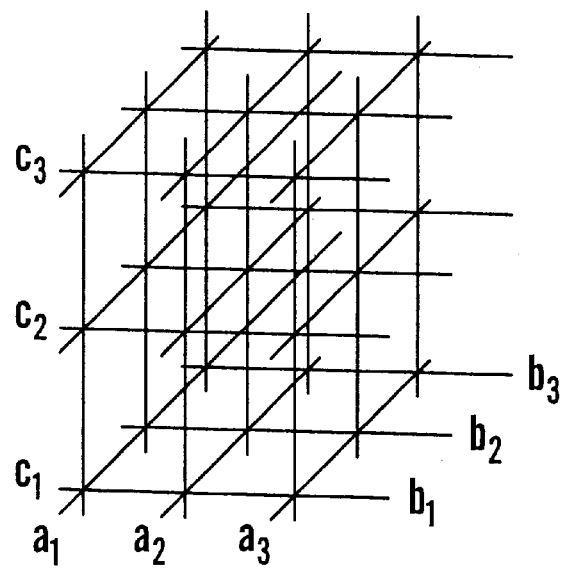

FIG. 2 shows as also already discussed in the introduction, shows a prior art orthogonal three-terminal matrix-addressing scheme in three dimensions. Each crossing point between electrode lines defines a physical co-ordinate in the matrix and can accommodate a three-terminal circuit element or device.

In order to better elucidate the general background and principles of the present invention there shall now be given a brief discussion of how a prior art three-terminal device consisting of two terminal subunits in principle can be addressed by three sets of parallel electrodes arranged in orthogonal relationship to the overlying or underlying adjacent electrode set. In this connection it is, however, important to note that this device is nothing more than a simple extension of the prior art passive matrix device with addressing to cells defined by the electrode crossings and consequently comporting the same disadvantages as already set forth in the discussion of the prior art in the introduction.

Figure 3A:
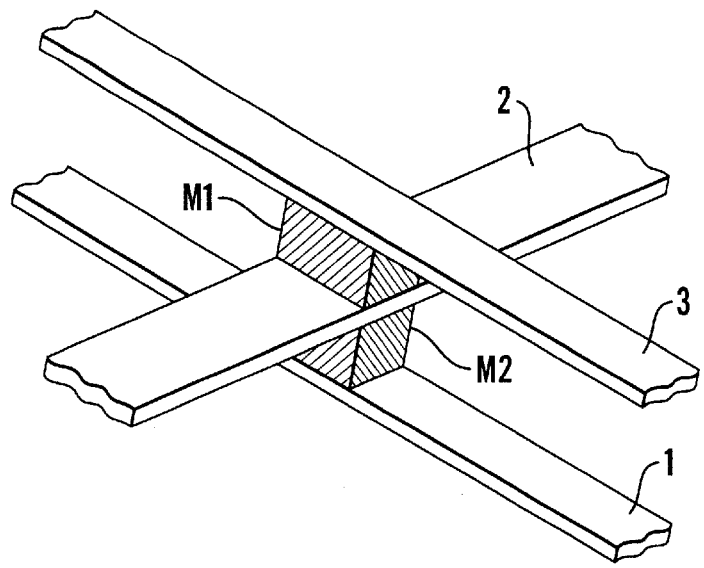

If each element in a two-dimensional array has two sub-units, each of which is of the two-terminal type, the element can in principle be addressed via an orthogonal passive matrix network. A prior art scheme of this kind is shown in FIGS. 3a,b, wherein only three electrode layers labelled 1, 2 and 3 are provided in what may be part of a stack with many more layers. The two elements M1,M2 which in FIG. 3a are shown sandwiched between the overlap regions of the electrodes, i.e. between electrodes 1 and 2, and between electrodes 2 and 3, can be activated separately by proper electrical stimulation of the crossing electrodes. A true three-terminal element located in or adjacent to the electrode-crossing region cannot be sandwiched in the manner shown in FIG. 3a, i.e. as two separate segments, and shall require at least one separate direct connection to the third electrode. This orthogonal passive matrix addressing has several drawbacks.

Figure 3B:
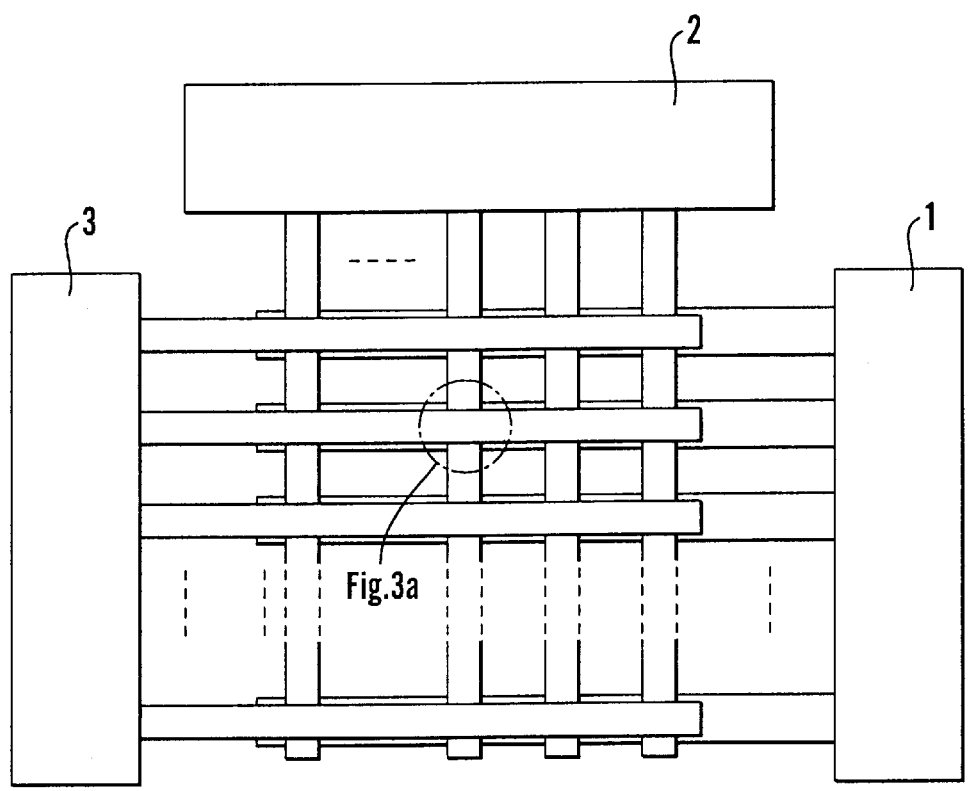

As can be seen from FIG. 3b, the orthogonal electrode arrangement involves long parallel coupling paths causing inductive and/or capacitive cross-talk between electrodes in every second electrode layer in a stack as shown. More importantly, in device structures based on global functional layers between the electrode sets, there is a fundamental limitation due to the massive overlap of electrodes 1 and 3 outside the crossing area containing the device, namely if each functional layer can conduct in the direction perpendicular to the layers, a direct leakage current path exists between electrodes 1 and 3, along the full length of the electrodes from the crossing point to the edge of the matrix. This is a serious limitation, excluding important applications such as memory devices with one bistable memory layer (between electrodes 1 and 2) and one current control, or switching layer (between electrodes 2 and 3).

Furthermore there is a rapidly increasing problem of crowding in supporting electronics and connections at the edges of the addressing matrix as the number of terminals at each element address increases. As shown in FIG. 3b, this can be somewhat alleviated by placing the drive electronics for the electrode sets 1 and 3 at opposite sides of the matrix. This strategy provides only a maximum of four separately driven electrode sets, corresponding to a four-layer stack instead of the three-layer one shown in FIG. 3a. As mentioned above, however, stacks with a larger number of layers may be desirable in many instances. It may also be desirable that all the electronics should be located on a common substrate, e.g. a silicon wafer. This implies that orthogonal matrix stacks of the type shown in FIG. 3b and containing more than four electrode layers shall need high-density electrode connections extending over longer distances to other, unused parts of the substrate, which is undesirable in most cases. Alternatively, driving electronics modules belonging to different electrode sets must be stacked on top of each other. This comports a host of undesirable features, e.g. the need for other types of semiconductor technologies (thin-film transistors, etc.) and complications related to crosstalk, thermal management and processing incompatibilities related to stacked active circuitry.

Figure 4:
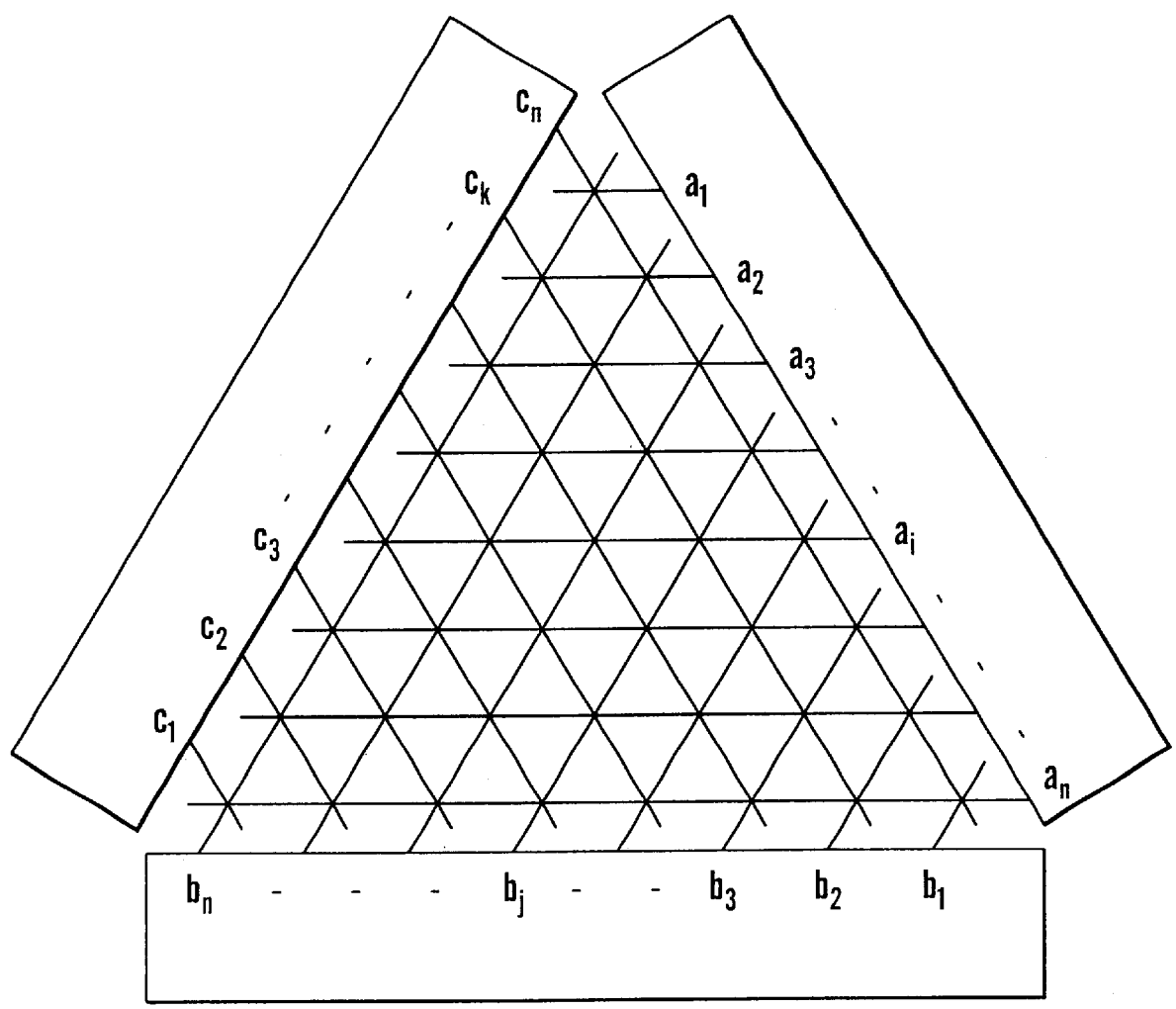

FIG. 4 illustrates the basic principle of the means, i.e. an addressing matrix according to the present invention. The matrix accommodates three-terminal devices or cells in a planar arrangement. Electrode means comprising three planar sets of electrode lines $a_i$, $b_j$ and $c_k$ is shown projected onto a common plane. In each set, the electrode lines are parallel to each other. Each electrode set is rotated a certain angle relative to the two other sets, and electrodes from one set cross the other two electrode sets at common crossing points where the devices to be addressed are located. While shown in a single plane, electrode sets that are rotated with respect to each other are physically separated at the crossing points and typically lie in separate planes. The latter may, however, be in close proximity to each other, separated by a patterned or global thin film which forms the volume element of the matrix (not shown in FIG. 4). In this example, devices or functional elements located at the crossing points in the matrix can be accessed by up to N=3 independent terminal connections leading to the edge of the matrix where the electrodes can be linked to driving and sensing circuitry.

The various electrode sets can be rotated such as to offer a symmetrical arrangement with no overlap even for a large N, e.g. with the angles between neighbour planes (or layers or sets) given by 360/mN, where N is the number of terminals and m an integer less than or equal to N. As now no two neighbour electrode sets conformally overlap, capacitive couplings will largely be avoided.

An important aspect of the present invention which sets it apart from prior art can be seen clearly by viewing FIG. 4 in conjunction with FIG. 3. As was discussed above, the prior art arrangement in FIG. 3 cannot be used with devices made with global functional layers that conduct in the direction perpendicular to the layers, due to the extensive overlap of electrodes in the sets 1 and 3. Also, the overlap may cause excessive inductive or capacitive crosstalk. In the non-orthogonal case illustrated in FIG. 4, the only point of overlap between the three electrodes communicating with a given device is at the crossing point. Clearly, while shown here for electrode arrangements with N=3, the same also applies to non-orthogonal matrices with N>3.

Comparing now the true three-dimensional prior art matrix shown in FIG. 2 and the addressing matrix according to the present invention as shown in FIG. 4, there should be noted that in the latter case an element can be wholly defined by selecting only two non-parallel lines. Thus, exclusive addressing to the element in the crossing between $a_i$, $b_j$ and $c_k$ is obtained from both $(a_i, b_j)$, $(a_i, c_k)$ and $(b_j, c_k)$ pairs as well as the triple $(a_i, b_j, c_k)$.

Every element in the matrix as described above is related to three lines that can be electrically activated independently from each other, either in pairs or triples. Note, however, that valid i,j,k combinations are subject to the following selection rule:

$i+j+k=2n+1$, where $n=i_{max}=j_{max}=k_{max}$.

This selection rule not only applies for electrode arrangements forming equilateral triangles as shown in FIG. 4, but also quite generally for electrodes forming triangular crossing patterns where the triangles may be of arbitrary shape but with common crossing points.

Now variants of a first embodiment of addressing matrices according to the invention should be discussed. These variants all accommodate four-terminal devices or cells in a planar arrangement.

Figure 5A:
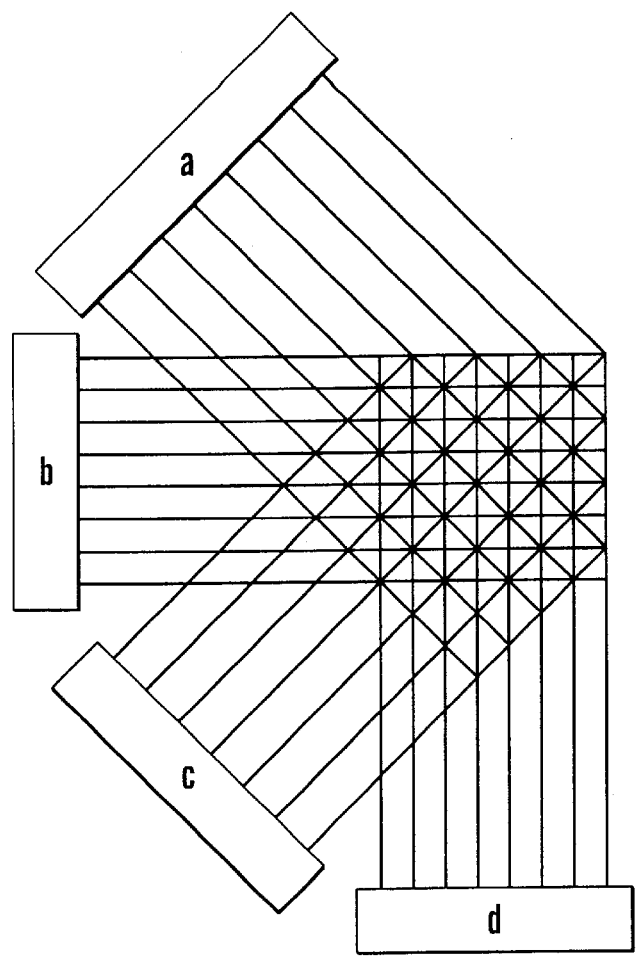
Figure 5B:
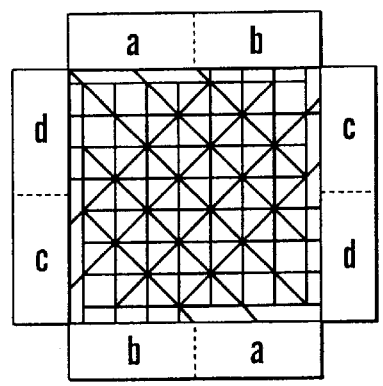

FIGS. 5a and 5b show an extension of this principle to the case with N=4. The addressing matrix is the same in both cases, but the external connection arrangement in FIG. 5b is more compact than that in FIG. 5a. As can be noted, in addition to the four-terminal crossing points there also exist crossings between two lines only, oriented at right angles to each other. These dual line crossings shall in principle represent a loss of addressing density, if only four-terminal addressed devices or device clusters are to be incorporated into the matrix. However, in certain instances it may be desirable to include both two- and four-terminal devices into the same matrix, increasing the device density.

Figure 5C:
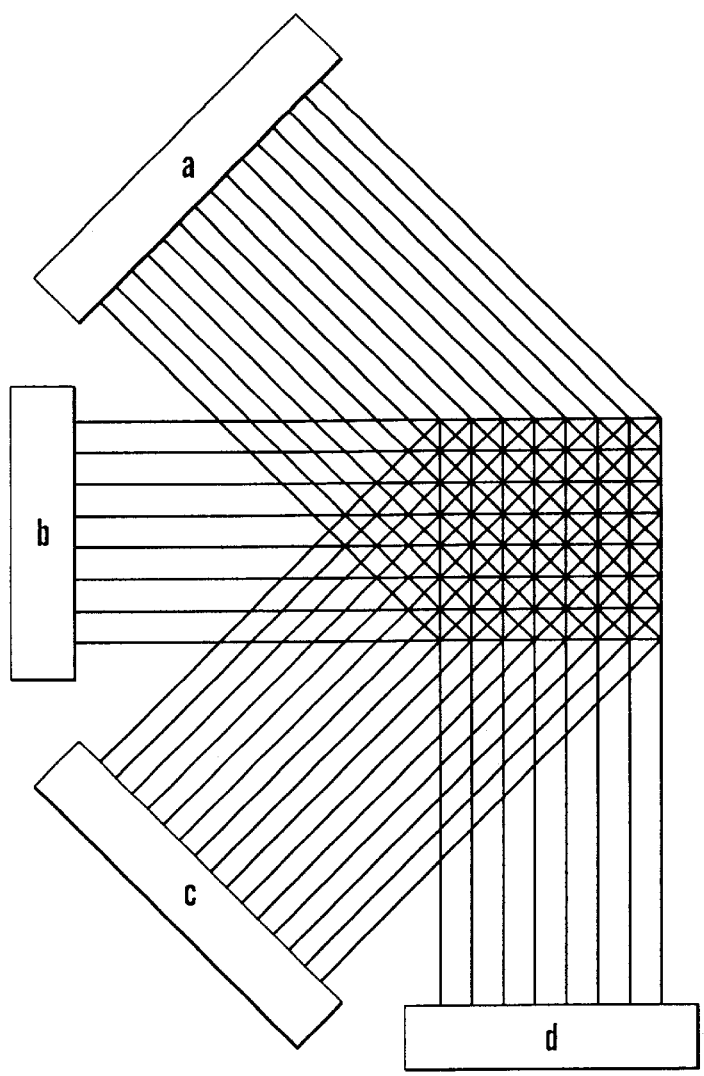
Figure 5D:
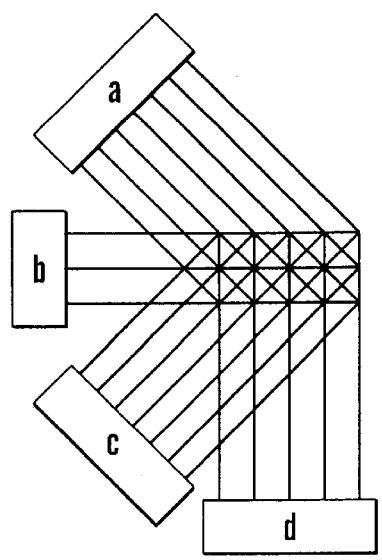

In the variants shown in FIGS. 5a and 5b the addressing matrix is rendered as a square with 8×8=64 elements or devices. However, with the number of addressing lines restricted to 8 for each of the electrode sets a, b, c, d the number of four-terminal devices will be less than 64. A variant embodiment which allows 64 four-terminal elements in square 8×8 matrix is shown in FIG. 5c. The electrode sets b, d each comprises 8 lines respectively parallel to the rows and columns of the matrix and are thus able to access all 64 elements in the matrix. The electrode sets a, c which are rotated by 45 degrees with respect to sets b, d, however, must each comprise 15 lines in order to access all 64 elements. Generally one has for a matrix p;q that the number of lines parallel with the diagonal of the matrix is given by p+q−1, or for p=q; 2p−1. An 8×8 matrix thus must have 15 lines in diagonal electrode sets. The same principle is also shown applied to a 5×3 matrix in FIG. 5d, where the electrode sets a, c each must comprise 5+3−1=7 lines in order to create a 15-element rectangular matrix with a complete four-terminal access to all elements.

By simple extension of the basic principle of rotating sets of parallel addressing electrodes, addressing matrices can be created with N>4.

With reference to FIGS. 6a–6f and 7a–7e variants of respectively second and third embodiments of the invention shall now be discussed. Examples of components that can be included in addressing matrices according to the present invention are sensing devices, memory cells, transistor components and three- or multi-terminal circuitry. The present invention provides for the first time the opportunity of creating in a practical manner quasi two-dimensional networks containing devices of this type. Planar devices with passive as well active matrix characteristics are included, one class of examples being active matrix displays with cells that are luminescent (e.g. LED, microlaser array, gas discharge) or reflection/transmission modulating (e.g. LCD, MEM). Also, memory devices with SRAM, DRAM and FRAM architectures are clearly included (cf. the 4-terminal SRAM cell in FIG. 1). As obvious to persons skilled in the art, the total range of applications extends much beyond the examples given here, which examples shall not in any way be taken to limit the scope of the present invention.

FIGS. 6a–6f and 7a–7e all disclose variants of embodiments involving N=3 connections at the crossing points between three electrode sets according to the present invention. Two distinct cases are treated, illustrating the flexibility of the present invention: In FIGS. 6a–6f three-terminal devices or cells are hooked up to the three lines at the crossing point (matrix address). In FIGS. 7a–7e, two or more two-terminal devices or cells are clustered at a crossing point (matrix address), with different connections to three crossing electrodes at this point.

Figure 6A:
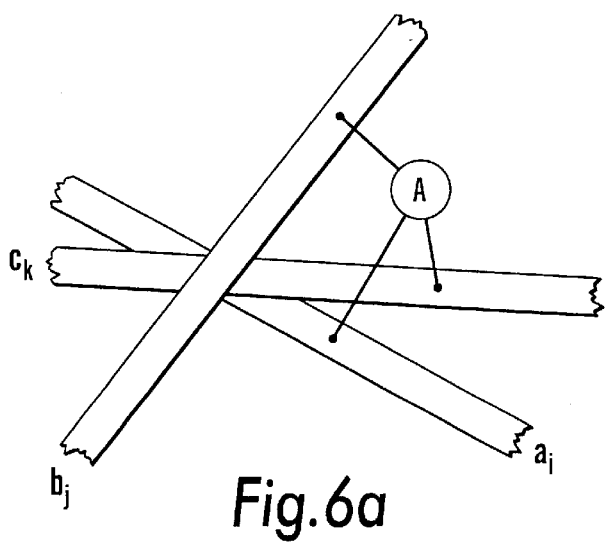
Figure 6B:
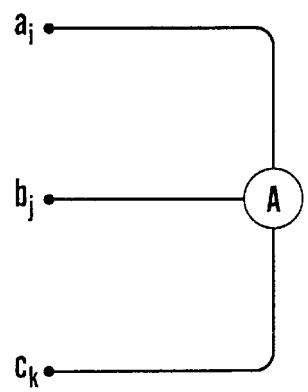
Figure 6C:
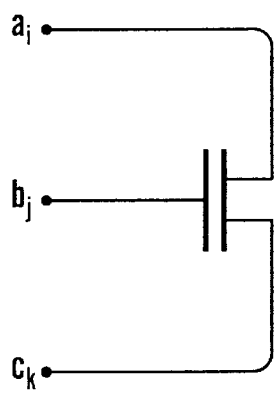
Figure 6D:
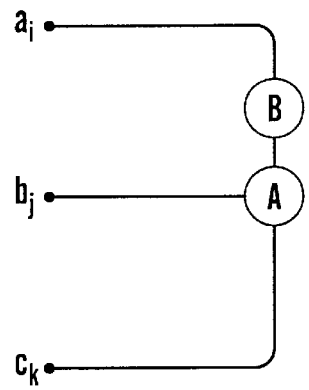
Figure 6E:
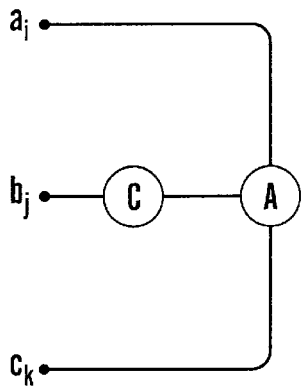
Figure 6F:
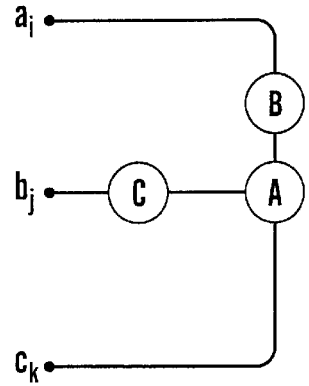

In the first case, as shown in FIGS. 6a–6f, a single, three-terminal device or cell, here termed A, is connected to the three crossing electrode lines. FIG. 6a is a perspective drawing where A is hooked up to three electrode lines at a crossing point between the latter, while FIG. 6b is the corresponding schematic illustration. A may be a transistor as shown in FIG. 6c, typically connected to other components to perform a variety of different tasks. One example is a light-emitting pixel in a display, as shown in FIG. 6d, where the light emitter B is driven by the transistor A, under the control of the gate line bj. Another example is given in FIG. 6e, where a chemical or physical sensing component C is incorporated into the gate connection. With the other crossing points in the matrix similarly equipped, there results a two-dimensional sensing or imaging apparatus. By incorporating all of the components A, B and C as shown in FIG. 6f, a two-dimensional display is created where the spatial distribution of light emission corresponds to the spatial distribution of the strength of the input stimulus to component C.

In the second case, as illustrated in FIGS. 7a–7e, up to three two-terminal components or devices A, B and C are connected at a given matrix address, i.e. electrode crossing point $(a_i, b_j, c_k)$ in the matrix. Now, the components may be activated independently of each other, i.e. the same crossing point is addressed by activating any of the pairs of electrodes $(a_i, b_j)$ or $(a_i, c_k)$ or $(b_j, c_k)$, cf. the perspective drawing in FIG. 7a and the schematic presentation in FIG. 7b.

Figure 7A:
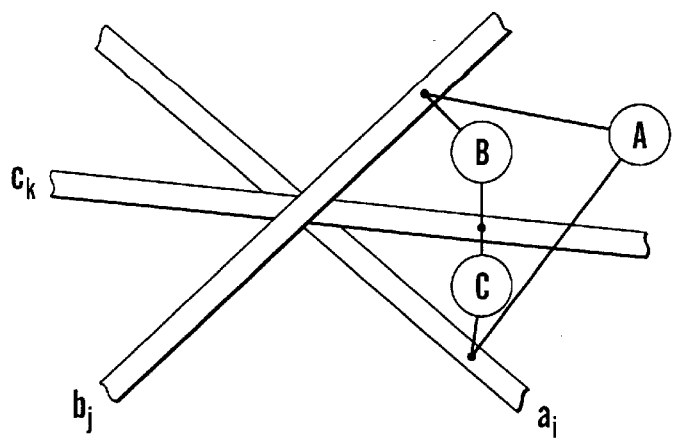
Figure 7B:
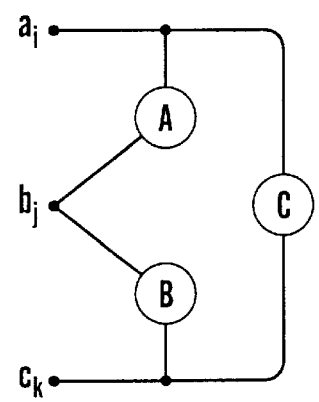
Figure 7C:
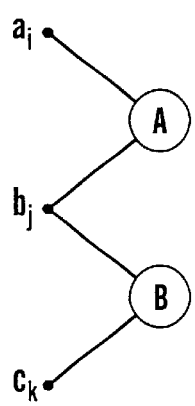
Figure 7D:
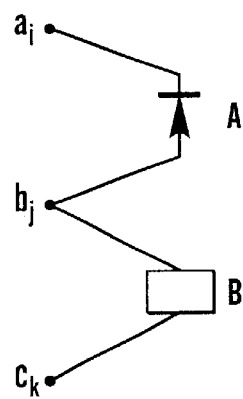

FIG. 7c shows a schematic for the case of two two-terminal components or devices, A and B, which are both located at the same matrix address (i.e. crossing point between three electrodes, in this case). A constellation of this kind, suitable for use in passive matrix WORM (Write Once Read Many times) or REWRITABLE memories, is shown in FIG. 7d, where A and B are a rectifying diode and a memory cell, respectively. Here, the diode A provides suppression of parasitic current loops ("sneak currents") in a passive matrix addressing scheme, while B can be prepared in a given logic state followed by a reading operation where that logic state is determined. In one class of WORM memories, B is a fuse that under the writing operation changes its resistance from moderate or low to high or infinite. While this is possible in principle in a two-dimensional passive matrix scheme, i.e. as in FIG. 7d without the middle electrode $b_j$, it implies that a high current must pass through the diode during the writing operation. This puts restrictions on the diode construction and performance which generally lowers the overall performance of the memory. The third electrode $b_j$ as shown in FIG. 7d provides direct access to the isolated memory cell during writing and can effectively be disconnected during reading, thus providing opportunities for optimizing A and B separately. There are important cases, where the third electrode connection accessing the memory cell B as in FIG. 7d is critical: In certain types of REWRITABLE memories, the write/read/erase protocols involve the application of voltages across the memory cell that have different polarities and may vary widely in magnitude. This can be achieved with passive matrix addressing by the scheme in FIG. 7d, but is clearly impossible with the terminal $b_j$ removed.

Figure 7E:
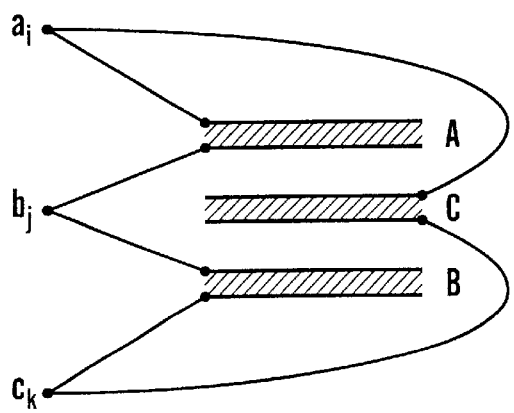

FIG. 7e shows a three-element (full-color) pixel in an emissive, reflective or transmissive display, where each element A, B and C can be subjected to the different voltages $V_A, V_B, V_C$, respectively. It should be noted that for voltages applied to all three electrodes simultaneously, the following condition applies:

$$V_A + V_B = V_C$$

This does not preclude individual control of A, B and C, which can be achieved by time multiplexing. The latter does imply, however, that the duty cycle for electrically stimulating each element cannot be 100% in the general case.

A preferred embodiment of the present invention shall now be discussed somewhat specifically with reference to FIGS. 8a,b which illustrates a physical embodiment of a passive matrix addressing system with N=3, based on sandwiching of global layers of functional materials between the three sets of electrodes. FIG. 8a specifically shows a single cell at the crossing of electrodes a,b,c, and functional material M1,M2 interspersed between two and two electrodes, a,b and b,c respectively, while the resulting matrix is shown in FIG. 8b wherein the cells with functional materials M1,M2 are formed in the volume elements defined in the crossing points by the overlapping ribbon-like electrodes. In many preferred embodiments, the materials in the layers are non-crystalline materials that can be deposited by one of several possible methods, e.g. spin coating, sputtering, doctor blading, etc. The manufacturing sequence is as follows:

1. The first electrode layer is placed on the substrate:
2. Material M1 is deposited on top of the first electrode.
3. The second electrode layer is placed on top of material M1.
4. Material M2 is deposited on top of the second electrode layer.
5. The third electrode layer is then placed on top of Material M2.

The material layers must not exhibit too large electrical conductance in the lateral direction (i.e. perpendicular to the film thickness), to avoid excessive crosstalk between electrodes in the matrix. In applications where a certain finite conductance is inherent in the layer materials, crosstalk is minimized by employing layers that are sufficiently thin, or which have been patterned with voids between the electrode lines. Alternatively, the layers may be created with anisotropic conductance, where currents in the lateral direction are suppressed.

Figure 9:
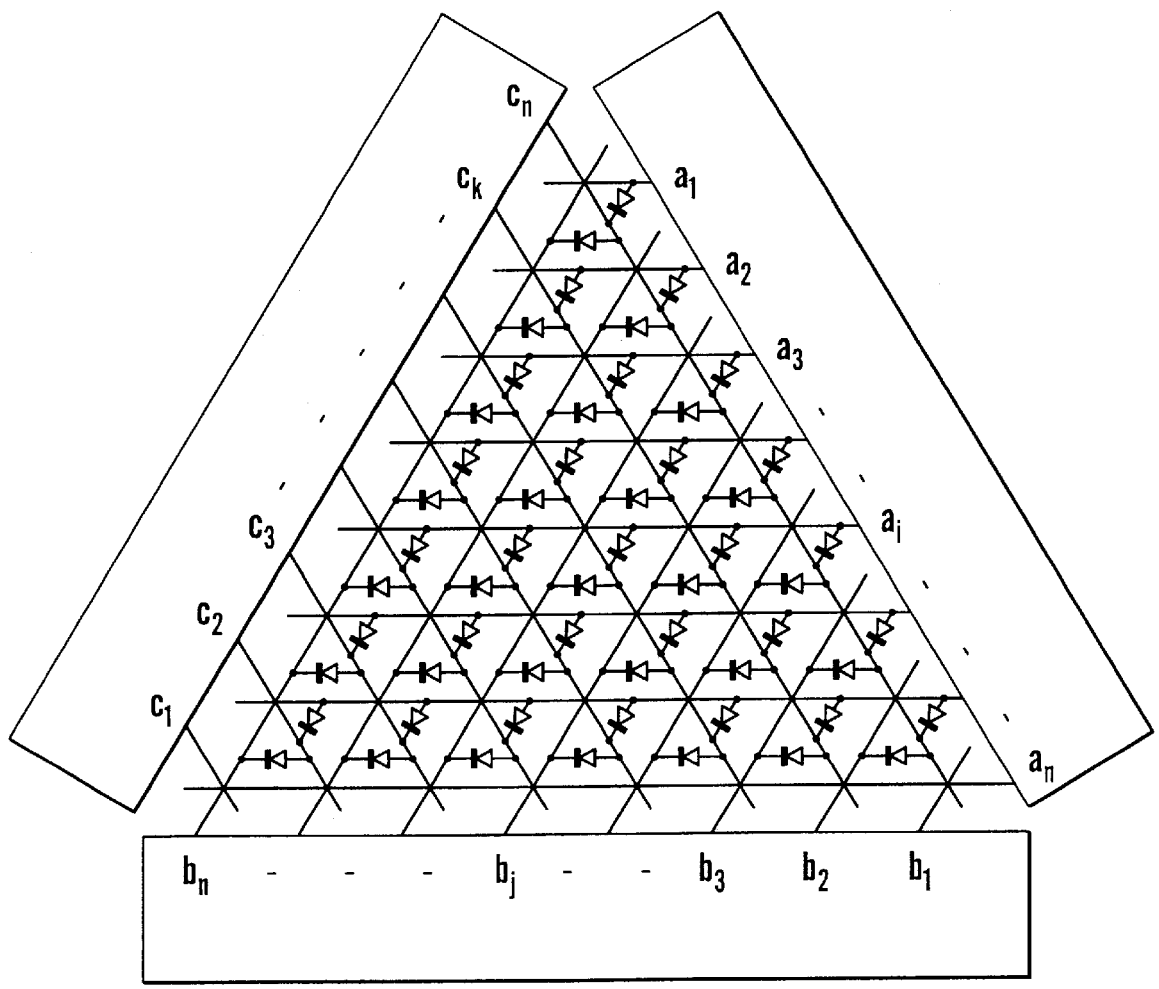

The problem of "sneak currents" is well-known in prior art passive matrix addressing with two orthogonal sets of electrodes and to some degree discussed together with measures of its remedial in the three above-mentioned PCT applications belonging to the applicant. These sneak currents are spurious current paths within the network of addressing electrodes, involving crossing between electrodes at several non-addressed crossing points. Typically, such currents are suppressed by using a non-linear impedance element, e.g. a rectifying diode in each cross-point. The same remedy shall also be applicable in devices according to the present invention, as can be seen by inspection of FIG. 9 which shows three-terminal devices in a triangular matrix where each device includes a rectifying diode.

The physical structure in FIG. 8a is useful in creating devices of the class typified in FIG. 7c (which includes the examples shown in FIGS. 7d, 7e). In memory devices as per FIG. 7d, the diode is formed spontaneously in the contact region between the electrode $a_i$ and a suitably chosen semiconductor, e.g. a conjugated polymer that constitutes material M1, while the memory cell B is formed by employing an appropriate memory substance as material M2 between the crossing electrodes $b_j$ and $c_k$. Similar structures can be used to build displays, in which case material M1 and material M2 either emit light upon electrical stimulation (e.g. light emitting conjugated polymers) or modify light by absorption, reflection or polarization (e.g. liquid crystals). Clearly, in the case of display with the volume elements or elements, that is a functional medium wholly sandwiched between the electrodes at least the electrodes or electrodes in a set on one side of the volume element of elements must be transparent, with the possible exception of one electrode at the outer end of the sandwich.

It is to be understood that material M1 and material M2 in FIG. 8a which together constitute the volume element contacted by electrodes a, b and c could be formed as global layers extending throughout the matrix and the region wherein a selective interaction within a volume element takes place will of course be located between the electrodes at crossing thereof, thus defining a cell in said volume element. Patterned volume elements of the kind shown in FIG. 8a would, however, be advantageous for realizing more complicated circuitry, as may be the case with the embodiments in FIGS. 6f, 7b or 7e. In such cases could e.g. a part of the volume element be separated from other parts between two and two of the electrodes, and extend between the uppermost and the lowermost electrode in close proximity to the crossing thereof. In other words, the addressability to a volume element in an electrode crossing does not imply that a single cell volume element in this case cannot be activated in regions extending beyond the crossing of all three electrodes. It is possible to envisage that a patterned volume element could realize a cell in the form of a vertical transistor structure, with the source and drain electrodes formed by electrodes a and c respectively as depicted in FIG. 8a, while electrode b forms the gate electrode. Material M1 and material M2 must then have insulating properties while (not shown) semiconducting material (the transistor channel) would extend between electrodes a and c. Hence means according to the invention could be used for realizing matrices comprising vertical field-effect transistor structures of the kind disclosed in PCT/NO99/0013 which belongs to the present applicant.

In case a device embodying the teachings of the present invention is designed with structures similar to the one disclosed in the above-mentioned international application No. PCT/NO98/00212 at least a part or a component of a volume element will be freely exposed to the exterior, thus obviating the need for at least one set of transparent electrodes and making the device with two-dimensional matrix of this kind eminently suitable for use in cameras or display devices as mentioned.

In case devices with similar architectures as those disclosed in the above-mentioned PCT applications belonging to the present applicant shall be employed as data processing and data storage devices only, these devices of course, as disclosed therein, could be stacked to form a volumetric device. Two-dimensional matrices comprising the functional medium forming a global volume element in the matrix or patterned to form separate volume elements in each two-dimensional matrix can then be stacked to form the three-dimensional apparatus according to the present invention with the appropriate number of electrode sets, i.e. three or more assigned to each two-dimensional matrix in the three-dimensional stack thereof. In case an apparatus of this kind is a data storage device, the functional medium in the volume elements may be a suitable inorganic or organic thin-film material with electronic or electric properties that provides a volume element with required functionality, or of course, any suitable combination of such materials, including materials with the capability of forming spontaneous diode junctions with an adjoining metallic electrode, as discussed in the prior art.

The functional medium in a volume element may for the data storage purposes be based on a material exhibiting desirable impedance characteristic and allowing the permanent setting, detection and reading of an impedance value by means of applied voltages to selected electrodes for uniquely addressing a specific volume element or a cell thereof. The functional medium of volume elements may also be provided by a polarizable material, such as an electret material or a ferroelectric material which may be either an inorganic or organic thin film, in the latter case most suitably a copolymer of PVDF-TFE-type (polyvinylidenedifluoride-trifluoroethylene copolymer). Such materials are suitable for storing data in passive addressable matrices in which case, however, write and read procedures via selected word and bit line respectively to a specific cell or volume element may require grounding and/or biasing of the other forming word and bit lines not selected, in which case devices with three or more terminals at each cell embodying the principles of the present invention shall be advantageous. Similar considerations apply to e.g. active memory devices wherein memory cells each comprises one or more transistors as will be the case of prior art SRAM and DRAM devices or with a memory with cells with cells combining active and passive principles, e.g. ferroelectric data storage devices with memory cells comprising at least one transistor and at least one ferroelectric capacitor and wherein again a volume element or a memory cell thereof may be provided as a device with three or more terminals embodying the principles of the present invention.

What is claimed is:

1. A means for providing addressability in an apparatus comprising one or more volume elements, wherein said volume or volume elements together with said means form a part of a two- or three-dimensional matrix in said apparatus, wherein a volume element comprises one or more cells having a data storage, data-processing or signal-processing functionality depending on the electronic or electric properties of a material of said volume element, wherein said means provides addressability to a specific location in a volume element by establishing a selective electrical connection to said volume element or in case said volume element comprises more than one cell, a specific cell thereof, wherein the selection of a specific volume element or cell thereof takes place by providing a not necessarily simultaneous electrical connection to three or more electrodes formed by said means and contacting said volume element for effecting a selective interaction therewith in a region thereof in close proximity to said electrodes, and wherein said region defines a cell in said volume element thus interacted upon, and said means comprises at least three sets of plural electrically conducting lines or strip-like electrodes, each electrode set comprises said strip-like electrodes provided in a substantially parallel relationship to each other in a respective two-dimensional planar layer in said matrix, said layers of electrode sets being substantially mutually parallel, a set of strip-like electrodes in one layer being oriented at an angle to the projected angle of orientation of the electrode sets of the proximal neighbouring layers on said one layer, such that said sets of strip-like electrodes in proximal neighbouring layers exhibit a mutual non-orthogonal relationship, and said electrodes contacting said region of a volume element are formed by a crossing of three or more of said strip-like electrodes in said respective electrode sets contacting said volume element, such that said cell or cells of said volume element in any case is located therein between or at said crossing of said three or more strip-like electrodes, a selective addressing of a cell taking place by applying a current or voltage to a selected strip-like electrode in each of the electrode sets either simultaneously or in a temporal sequence defined by a predetermined addressing protocol.

2. The means according to claim 1,
characterized in that substantially parallel strip-like electrodes of an electrode set are provided equidistantly spaced apart.

3. The means according to claim 1,
characterized in that in an electrode set in the matrix is provided rotated about an axis substantially perpendicular thereto, by a given angle or angles, in relation to at least the proximal neighbouring electrode sets, such that none of the strip-like electrodes in said proximal neighbouring electrode sets conformally overlap.

4. The means according to claim 1,
characterized in that all electrode sets in the matrix are provided mutually rotated about an axis substantially perpendicular thereto, by a given angle or angles such that none of the strip-like electrode in any other electrode sets conformally overlap.

5. The means according to claim 4, characterized in that the given angle of rotation between an electrode set and a following proximal neighbouring electrode set is $2\pi/m \cdot N$ or $360° \text{ mN}$, N being the number of the strip-like electrodes respectively contacting a terminal in a cell and m an integer such that $m \leq N$.

6. The means according to claim 1,
characterized in comprising three electrode sets for providing an electrical connection to cells with up to three terminals.

7. The means according to claim 1,
characterized in comprising four electrode sets for providing an electrical connection to cells with up to four terminals.

8. The means according to claim 1,
characterized in comprising three electrode set for providing an electrical connection to at least two cells with up to two terminals each.

9. The means according to claim 1,
characterized in the number of strip-like electrodes provided in a respective electrode set being selected with regard to the number and geometrical arrangements of the cells in the matrix, so as to maximize the number of addressable cells therein.

10. The means according to claim 9,
characterized in the number of strip-like electrodes provided in a respective electrode set being selected so as to enable the addressing of a cell in the matrix.

11. The means according to claim 1, wherein each cell in a volume element in a matrix is provided with at least two terminals,
characterized by providing the electrode layers and the layer or layers forming the volume element in a sandwich arrangement, an electrode adjoining a surface of at least one volume element layer in an interfacing relationship thereto,
whereby the crossing between the strip-like electrodes in each electrode layer defines a cell in the volume element.

12. The means according to claim 11,
characterized in providing a diode junction between an electrode in an electrode crossing and a cell defined thereby.

13. The means according to claim 1, wherein one or more cells in the volume element comprises at least one transistor structure,
characterized by at least one electrode in at least two electrode sets respectively contacting the terminals of said at least one transistor structure.

14. The means according to claim 13, wherein more than one volume element comprises more than one transistor structure,
characterized by at least one electrode in at least two electrode sets respectively connecting the transistors electrically with each other via the terminals thereof.

15. An apparatus comprising means for providing addressability including one or more volume elements, wherein said volume or volume elements together with said means form a part of a two- or three-dimensional matrix in said apparatus, wherein a volume element comprises one or more cells having a data storage, data-processing or signal-processing functionality depending on the electronic or electric properties of a material of said volume element, wherein said means provides addressability to a specific location in a volume element by establishing a selective electrical connection to said volume element or in case said volume element comprises more than one cell, a specific cell thereof, wherein the selection of a specific volume element or cell thereof takes place by providing a not necessarily simultaneous electrical connection to three or more electrodes formed by said means and contacting said volume element for effecting a selective interaction therewith in a region thereof in close proximity to said electrodes, and wherein said region defines a cell in said volume element thus interacted upon, and said means comprises at least three sets of plural electrically conducting lines or strip-like electrodes, each electrode set comprises said strip-like electrodes provided in a substantially parallel relationship to each other in a respective two-dimensional planar layer in said matrix, said layers of electrode sets being substantially mutually parallel, a set of strip-like electrodes in one layer being oriented at an angle to the projected angle of orientation of the electrode sets of the proximal neighboring layers on said one layer, such that said sets of strip-like electrodes in proximal neighboring layers exhibit a mutual non-orthogonal relationship, and said electrodes contacting said region of a volume element are formed by a crossing of three or more of said strip-like electrodes in said respective electrode sets contacting said volume element, such that said cell or cells of said volume element in any case is located therein between or at said crossing of said three or more strip-like electrodes, a selective addressing of a cell taking place by applying a current or voltage to a selected strip-like electrode in each of the electrode sets either simultaneously or in a temporal sequence defined by a predetermined addressing protocol, wherein said means together with one or more volume elements form a part of a two- or three-dimensional matrix in said apparatus, wherein a volume element comprises one or more cells having a data storage, data-processing or signal-processing functionality depending on the electronic or electric properties of a material of said volume element, and wherein the apparatus comprises more than one matrix of this kind, the matrices being provided in a stacked arrangement, wherein the apparatus forms a volumetric structure of stacked matrices for data storage, data processing or a single processing as given by the functionality of each matrix in the stack.

16. The apparatus according to claim 15, characterized in being provided on a substrate comprising integrated circuitry connected with the electrodes of the means for implementing driving control and error correcting functions in the cells of the volume elements of the matrices.

* * * * *